United States Patent [19]
Corzine et al.

[11] Patent Number: 5,838,715
[45] Date of Patent: Nov. 17, 1998

[54] HIGH INTENSITY SINGLE-MODE VCSELS

[75] Inventors: Scott W. Corzine; Dubravko I. Babic, both of Sunnyvale; Richard P. Schneider, Jr., Mountain View; Michael R. Tan, Menlo Park; Shih-Yuan Wang, Palo Alto, all of Calif.

[73] Assignee: Hewlett-Packard Company, Palo Alto, Calif.

[21] Appl. No.: 667,259

[22] Filed: Jun. 20, 1996

[51] Int. Cl.$^6$ .................................. H01S 3/08; H01S 3/19
[52] U.S. Cl. .................................. 372/96; 372/50; 372/46; 372/101
[58] Field of Search .................................. 372/96, 92, 46, 372/45, 50, 108, 101, 19, 29, 32

[56] References Cited

U.S. PATENT DOCUMENTS

| | | | |
|---|---|---|---|
| 4,675,875 | 6/1987 | Takamiya | 372/45 |
| 5,073,041 | 12/1991 | Rastani | 372/101 |
| 5,253,262 | 10/1993 | Kurobe et al. | 372/45 |
| 5,317,170 | 5/1994 | Paoli | 257/88 |
| 5,633,527 | 5/1997 | Lear | 372/44 |

*Primary Examiner*—Rodney B. Bovernick
*Assistant Examiner*—Quyen Phan Leung
*Attorney, Agent, or Firm*—Ian Hardcastle

[57] ABSTRACT

A VCSEL 101 comprising an optical cavity having an optical loss and a loss-determining element 117 coupled to the optical cavity. The loss-determining element 117 progressively increases the optical loss of the optical cavity with increasing lateral distance from the optical axis 105. The optical cavity includes a first mirror region 111, a second mirror region 107, a plane light-generating region 125 sandwiched between the first mirror region 111 and the second mirror region 107, perpendicular to the optical axis 105, and an element 113 that defines the lateral extent of the optical cavity in the plane of the light-generating region 125. The first mirror region 111 and the second mirror region 107 are both conductive and have opposite conductivity modes.

20 Claims, 6 Drawing Sheets

HIGH INTENSITY SINGLE-MODE VCSELS

FIELD OF THE INVENTION

The invention relates to semiconductor lasers, and, in particular, to vertical cavity surface emitting semiconductor lasers having a high-intensity single mode output.

BACKGROUND OF THE INVENTION

Vertical-cavity surface-emitting lasers (VCSELs) have many advantages over traditional edge-emitting lasers, such as low manufacturing cost, high yield, good beam quality, and scalable geometries. These properties make VCSELs desirable for many applications. For example, K. H. Hahn, M. R. T. Tan, and S. Y. Wang describe using VCSELs in multimode fiber data links in *Modal and Intensity Noise of Large-Area Multiple-Transverse-Mode VCSELs in Multimode-Optical-Fiber Links*, 1994 CONFERENCE ON OPTICAL FIBER COMMUNICATION paper—ThB3, OFC '94. However, known VCSELs have a relatively low single-mode output power, which makes them unsuitable for certain applications. The single-mode output power of a VCSEL is defined as the maximum output power at which the light beam generated by the VCSEL has the lowest-order Gaussian intensity distribution. For example, a laser suitable for writing on a magneto-optical disc must generate a single-mode output power of about 30 mW, whereas the highest single-mode output power that can be generated by known VCSELs is about 2–3 mW.

VCSELs generate light by a laser current flowing through a large cross-sectional area of semiconductor material in a light-generating region. When the laser current is just above the threshold level, a VCSEL operates in a single transverse mode and radiates a light beam having a roughly lowest-order Gaussian intensity distribution. However, when the laser current is increased beyond a second, higher, threshold level, the laser switches to multimode operation in which higher-order intensity distributions are added to the fundamental lowest-order mode.

A VCSEL generates light in a central stimulated emission zone of the light-generating region. Since light generation depletes the density of carriers depending on the intensity of the light generated, operation in the lowest-order mode results in a depletion zone forming in the center of the stimulated emission zone, and a corresponding increase in the carrier density in a zone surrounding the depletion zone. When the carrier density in the depletion zone falls below a certain level, conditions become more favorable for the VCSEL to operate in its second-order mode. In the second order mode, the light beam generated by the VCSEL assumes a double-peaked Gaussian intensity distribution. At higher laser currents, additional depletion zones may form in the stimulated emission zone, causing the VCSEL to operate in higher-order modes. In these higher-order modes, the light beam generated by the VCSEL has a multiple-peaked Gaussian intensity profile. Operation in other than single mode makes the VCSEL unsuitable for use in applications in which a light beam having a single-peaked Gaussian intensity distribution is required.

Known VCSELs use a planar optical cavity and minimize the mode volume of the optical cavity in an attempt to limit the number of higher-order modes. Minimizing the mode volume so that only the fundamental mode can lase restricts the laser to oscillating in its fundamental $TEM_{0,0}$ mode. However, a mode volume that is small enough to restrict the laser to operating in its fundamental mode also limits the maximum output power that can be generated by the laser.

Accordingly, a requirement exists for VCSELs in which the onset of second and higher mode operation occurs, if at all, at much higher intensities than the maximum single-mode intensity generated by known VCSELs.

SUMMARY OF THE INVENTION

The invention provides a vertical cavity surface emitting laser (VCSEL) for radiating a high-intensity single-mode light beam along an optical axis. The VCSEL comprises an optical cavity having an optical loss and a loss-determining element coupled to the optical cavity. The loss-determining element progressively increases the optical loss of the optical cavity with increasing lateral distance from the optical axis. The optical cavity includes a first mirror region, a second mirror region, a plane light-generating region sandwiched between the first mirror region and the second mirror region, perpendicular to the optical axis, and an element that defines the lateral extent of the optical cavity in the plane of the light-generating region. The first mirror region and the second mirror region are both conductive and have opposite conductivity modes.

The loss-determining element may progressively increase the optical loss of the optical cavity with increasing lateral distance from the optical axis by diffraction, lateral spreading, or defocusing, or by imposing on the light in the optical cavity a reflection loss that progressively increases with increasing lateral distance from the optical axis.

The light-generating region may include a bulk active region or any number of quantum wells. The effect of the loss-determining element on increasing the optical loss of the optical cavity with increasing lateral distance from the optical axis depends inversely on the number of quantum wells in the light-generating a bulk active region or any number of quantum wells region. The effect of the loss-determining element is maximized when the light-generating region includes no more than one quantum well.

The invention also provides a vertical cavity surface emitting laser (VCSEL) that comprises an optical cavity having an optical loss, and a contoured loss control layer. The optical cavity includes a first mirror region, a second mirror region, a plane light-generating region sandwiched between the first mirror region and the second mirror region, perpendicular to the optical axis, and an element that defines the lateral extent of the optical cavity in the plane of the light-generating region. The first mirror region and the second mirror region are both conductive and have opposite conductivity modes. The contoured loss control layer is located on the surface of the first mirror region, remote from the active region, and includes a curved surface remote from the first mirror region and substantially centered on the optical axis.

The first mirror region may include a serial arrangement of a conductive mirror and a dielectric mirror, and the contoured loss control layer may be sandwiched between the conductive mirror and the dielectric mirror.

The contoured loss control layer may include semiconductor material transparent to light generated in the light-generating region, and the curved surface may be formed in the semiconductor material. Alternatively, the contoured loss control layer may include dielectric material transparent to light generated in the light-generating region, and the curved surface may be formed in the dielectric material.

The contoured loss control layer may alternatively include anti-reflective material that has a thickness of about $m\lambda/2n_4$ at the optical axis, and progressively changes in thickness by about $\pm\lambda/4n_4$ between the optical axis and a peripheral portion of the contoured loss control layer, where λ is the wavelength of the light generated in the light-generating region, m is an even integer, and $n_4$ is the refractive index of the anti-reflective material. The peripheral portion of the contoured loss control layer is adjacent the lateral extent of the optical cavity.

The dielectric mirror may include alternating layers of a high-index dielectric material and a low-index dielectric material having a refractive index less than that of the high-index dielectric material.

The anti-reflective material of the contoured loss control layer may have a refractive index closer to that of the high-index dielectric material than to that of the low-index dielectric material, in which case, the contoured loss control layer has a thickness of about $m\lambda/2n_4$ at the optical axis. Alternatively, the anti-reflective material of the contoured loss control layer may have a refractive index closer to that of the low-index dielectric material than to that of the high-index dielectric material, in which case, the contoured loss control layer has a thickness of about $p\lambda/4n_4$ at the optical axis, where p is an odd integer.

Finally, the invention provides a vertical cavity surface emitting laser (VCSEL) that comprises an optical cavity having an optical loss and a contoured loss control layer of anti-reflective material. The optical cavity includes a first mirror region, a second mirror region, a plane light-generating region perpendicular to the optical axis, and an element that defines the lateral extent of the optical cavity in the plane of the light-generating region. The first mirror region and the second mirror region are conductive and have opposite conductivity modes. The first mirror region comprises a serial arrangement of a multi-layer conductive mirror and a multi-layer dielectric mirror. The plane light-generating region is sandwiched between the conductive mirror and the second mirror region. The contoured loss control layer is sandwiched between the conductive mirror and the dielectric mirror, and has a thickness that progressively changes by about $\pm\lambda/4n_4$ between the optical axis and the peripheral portion of the contoured loss control layer.

The dielectric mirror may include alternating layers of a high-index dielectric material and a low-index dielectric material having a refractive index less than that of the high-index dielectric material. The anti-reflective material of the contoured loss control layer may have a refractive index closer to that of the high-index dielectric material than to that of the low-index dielectric material, in which case, the contoured loss control layer has a thickness of about $m\lambda/2n_4$ at the optical axis. Alternatively, the anti-reflective material of the contoured loss control layer may have a refractive index closer to that of the low-index dielectric material than to that of the high-index dielectric material, in which case, the contoured loss control layer has a thickness of about $p\lambda/4n_4$ at the optical axis.

BRIEF DESCRIPTION OF THE DRAWINGS

In the drawings, all of the Figures showing VCSELs are cross sectional views in the plane of the optical axis, perpendicular to the plane of the light-generating region.

DETAILED DESCRIPTION OF THE INVENTION

Figure 1A:
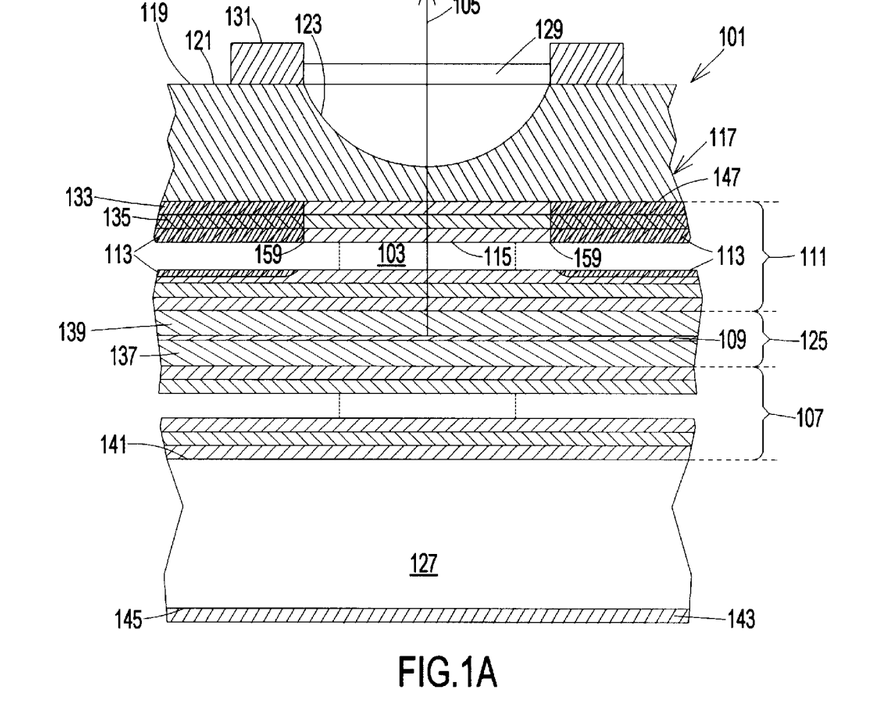
FIG. 1A shows a first embodiment of the VCSEL according to the invention in which the contoured loss control element is a layer of semiconductor.

FIG. 1A shows a first embodiment 101 of a vertical cavity surface emitting laser (VCSEL) according to the invention. The VCSEL 101 generates light that is radiated along the optical axis 105. In the VCSEL, the optical cavity 103 includes the lower mirror region 107 and the upper mirror region 111, which has an opposite conductivity mode from the lower mirror region. The optical cavity also includes the plane light-generating region 109 sandwiched between the lower mirror region and the upper mirror region, perpendicular to the optical axis. Finally, the optical cavity includes the low reflectivity zone 113 surrounding the core zone 115 in the upper mirror region. The low reflectivity zone defines the extent of the optical cavity in the lateral direction r relative to the optical axis.

The VCSEL 101 additionally comprises the loss-determining element 117 coupled to the optical cavity 103. The loss-determining element progressively increases the optical loss of the optical cavity with increasing distance from the optical axis 105 in the lateral direction r.

Single mode operation in VCSELs occurs close to the optical axis, whereas multi-mode operation occurs at locations laterally more remote from the optical axis. The increased optical loss in the optical cavity 103 at locations laterally more remote from the optical axis significantly increases the carrier density threshold required for multi-mode operation to begin. Since the loss-determining element 117 at least delays the onset of multi-mode operation in the VCSEL 101, the maximum single-mode light intensity that can be generated by the VCSEL is significantly increased.

In the first embodiment 101 of the VCSEL according to the invention shown in FIG. 1A, the loss-determining element 117 includes the contoured loss control layer 119. The loss control layer is contoured by the concave surface 123 in the surface 121 of the loss control layer, remote from the upper mirror region 111. In the embodiment shown in FIG. 1A, the contoured loss control layer is formed of a semiconductor material that is transparent to the light generated by the VCSEL 101. Other embodiments having other forms of the loss-determining element will be described below.

The first embodiment 101 of the VCSEL according to the invention will now be described in more detail. FIG. 1A shows a cross sectional view of the VCSEL in the plane of the optical axis 105 and perpendicular to the plane of the light-generating region 109. It should be noted that the figures do not show the VCSELs to scale. The thickness of all the layers of the VCSELs except the substrate 127 has been increased to show the layers more clearly. In actual devices, the thickness of the substrate is approximately 500 μm, while the combined thickness of the lower and upper mirror regions 107 and 111 and the active region 125 is about 6–7 μm. The light emission port 129 in the electrode 131 is typically about 10 μm across. Moreover, since each of the mirror regions 107 and 111 typically includes tens of layers, most of the layers have been omitted from the depiction of these regions in the drawings to simplify the drawings. Finally, the terms upper and lower are respectively used in this description to denote remoteness or proximity of various elements relative to the substrate 127, and not to indicate any particular spatial orientation.

The VCSEL 101 is structured to emit light having a wavelength of λ in vacuum, or of approximately λ in air. In the VCSEL, the optical cavity 103 is constituted by the active region 125 sandwiched between the lower and upper mirror regions 107 and 111, and its lateral extent is defined by the low reflectivity zone 113 in the upper mirror region. The materials of the upper and lower mirror regions are doped with suitable dopants to make them electrically conductive. One of the lower and upper mirror regions 107 and 111 is doped with a p-type dopant, and the other of them is doped with an n-type dopant so that the mirror regions 107 and 111 and the light-generating region 109 of the active region collectively form a p-i-n or an n-i-p diode.

The lower and upper mirror regions 107 and 111 are preferably distributed Bragg reflectors, as shown in FIG. 1A. Distributed Bragg reflectors have a periodic structure of thin semiconductor or dielectric layers, for example, the layers 133 and 135, with alternating higher and lower refractive indices. For example, the distributed Bragg reflector constituting the lower mirror region 107 may consist of 32.5 pairs of alternating AlGaAs and AlAs layers epitaxially grown on the substrate 127, preferably by molecular beam epitaxy (MBE) or metal-organic chemical vapor deposition (MOCVD). The distributed Bragg reflector constituting the upper mirror region 111 may consist of 20 pairs of alternating AlGaAs and AlAs layers. The upper mirror region 111 is grown on the active region 125, also preferably by MBE or MOCVD. Each layer of the distributed Bragg reflectors has a physical thickness of $q\lambda/4n_1$, where $n_1$ is the refractive index of the layer, and q is an odd integer.

The light-generating region 109 is located centrally in the active region 125. The light-generating region 109 preferably includes a number of quantum well structures (not shown) each composed of a quantum well and a barrier layer. The quantum well is preferably a layer of gallium arsenide (GaAs) and the barrier layer is preferably a layer of AlGaAs. Each quantum well structure preferably has thickness of about 80 Å.

The active region 125 has a total physical thickness equal to an integral multiple of $\lambda/2n_2$, where $n_2$ is the average refractive index of the material of the active region. The active region is composed of the lower cladding layer 137, the upper cladding layer 139 and the light-generating region 109 sandwiched between the lower cladding layer and the upper cladding layer. The cladding layers are layers of a semiconductor material having a different refractive index from that of the adjacent layers of the lower and upper mirror regions 107 and 111. The cladding layers 137 and 139 may be layers of AlGaAs, for example. Each of the cladding layers is doped to have the same conductivity mode as the adjacent mirror region.

The layers, e.g., 133 and 135, of the distributed Bragg reflectors constituting the lower and upper mirror regions 107 and 111 reflect most of the light generated in the light-generating region 109 back into the active region 125. Wave interference within the layers of the distributed Bragg reflectors reduces the light to standing waves of wavelength λ. By making the distributed Bragg reflector constituting the upper mirror region 111 less than totally reflective, coherent light having a wavelength of λ is emitted along the optical axis 105 in the direction perpendicular to the plane of the light-generating region 109.

The VCSEL 101 is formed by depositing a succession of layers on the surface 141 of the substrate 127.

The lateral extent of the optical cavity 103 in the plane of the light-generating region 109 is defined by the low reflectivity zone 113 in the upper mirror region 111. The reflectivity of the low reflectivity zone is so low that insufficient light is reflected back into the part of the light-generating region underlying the low reflectivity zone for light generation by stimulated emission to take place. Thus, the low reflectivity zone defines the lateral extent of the optical cavity 103. This extent corresponds approximately to the boundary 159 between the core zone 115 and the low reflectivity zone.

The electrical conductivity of the upper mirror region 111 is lower in the low reflectivity zone 113 than in the core zone 115. Consequently, the lateral extent of the laser current flowing through the upper mirror zone is confined to the core zone by the low reflectivity zone. The low reflectivity zone also confines the lateral extent of the laser current entering the active region 125 to a zone substantially coextensive with the core zone.

The low reflectivity zone 113 is formed in the upper mirror region 111 by ion bombardment, preferably performed using hydrogen ions. Ions of other suitable elements, such as helium or oxygen, may alternatively be used. Because ion bombardment disrupts the crystal structure, the low-reflectivity zone does not usually extend into the active region 125, but stops short in the upper mirror region as shown.

The low reflectivity zone may alternatively be defined by forming a native oxide region surrounding the core zone in at least one layer of the upper mirror region 111.

In the embodiment shown in FIG. 1A, the loss-determining element 117 is composed of the contoured loss control layer 119. The loss control layer is contoured by the concave surface 123 formed in the surface 121 of the loss control layer, remote from the upper mirror region 111. The contoured loss control layer is located on the surface 147 of the upper mirror region with the concave surface centered on the optical axis 105. The contoured loss control layer is a layer of semiconductor material that is transparent to the light generated in the active region 125. For example, in VCSELs operating in the near infra red, the contoured loss control layer is preferably a layer of gallium arsenide (GaAs) epitaxially grown on the surface 147 of the upper mirror region 111. Other semiconductor materials may be more suitable in VCSELs generating light at other wavelengths.

The material of the contoured loss control layer 119 is heavily doped with the same mode of dopant as is used to dope the upper mirror region 111. The contoured loss control layer is doped to enable it to conduct the laser current supplied via the electrode 131 to the core zone 115 with a negligible voltage drop.

The thickness of the contoured loss control layer 119 is determined by the dimensions of the concave surface 123: the thickness of the contoured loss control layer must be sufficient to accommodate the concave surface. The depth of the concave surface measured along the optical axis between the center of the concave surface and the part of the concave surface that overlies the boundary 159 of the core zone 115 is much greater than $\lambda/4n$, where n is the refractive index of the semiconductor material of the contoured loss control layer.

The concave surface 123 of the contoured loss-control layer 119 acts both to diffract the light in the optical cavity 103 and to spread or de-focus the light in the optical cavity laterally. Diffraction of the light in the optical cavity by the concave surface imposes on the optical cavity a diffraction loss that increases with the distance in the lateral direction r from the optical axis 105. The diffraction loss increasing with increasing distance in the lateral direction r from the optical axis 105 increases the diffraction loss in the optical cavity with respect to the higher-order modes, and therefore increases the optical loss of the optical cavity 103 with respect to the higher-order modes. The increase in the optical loss of the optical cavity with respect to the higher-order modes significantly increases the threshold carrier density required for the onset of higher-mode operation. Moreover, the spreading or defocusing of the light in the optical cavity 103 by the concave surface 123 increases the mode volume of the VCSEL 101. This further increases the output power that can be generated by the VCSEL before the onset of multi-mode operation. Consequently, the concave surface of the contoured loss-control layer increases the maximum single-mode power that can be generated by the VCSEL 101.

The electrode 131 is a metallized electrode of the appropriate type for the conductivity mode of the semiconductor material of the contoured loss control layer 119, and is located on the surface 121 of the contoured loss control layer, remote from the upper mirror region 111, centered on the optical axis 105. The electrode 131 is formed to include the light emission port 129 through which the light generated by the VCSEL is emitted. The light emission port is also centered on the optical axis, and surrounds the concave surface 123.

The electrode 143 is located on the back surface 145 of the substrate 127, and is a metallized electrode of the appropriate type for the conductivity mode of the substrate.

Preferably, the loss-determining element 117, the upper mirror region 111 and the upper cladding layer 139 are all doped with n-type dopants, and the lower cladding layer 137 and the lower mirror region 107 are both doped with p-type dopants. The substrate 127 is preferably an n-type GaAs wafer having a p-type surface layer 141 and a reverse-biassed tunnel junction (not shown) between the surface layer and the wafer.

Figure 1B:
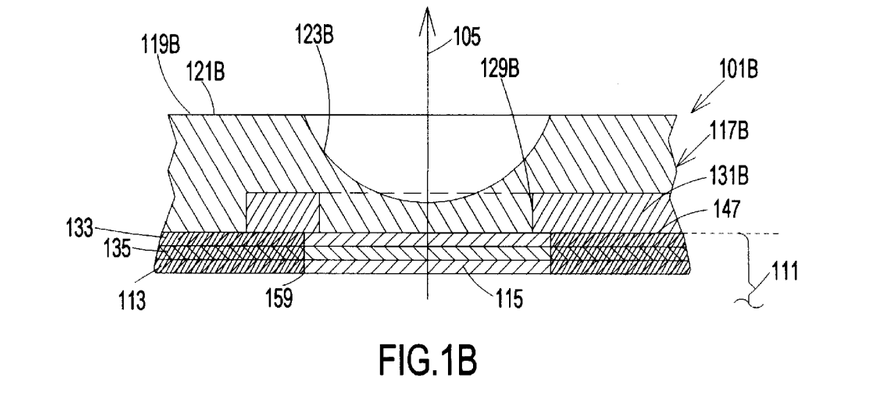
FIG. 1B shows a variation on the first embodiment of the VCSEL according to the invention in which the contoured loss control element is a layer of dielectric.

FIG. 1B shows a variation on the embodiment shown in FIG. 1A. Elements in FIG. 1B corresponding to elements in FIG. 1A are indicated by the same reference numerals and will not be described again here. Also, elements of the VCSEL below the upper part of the upper mirror region 111 are omitted from FIG. 1A, since these elements are identical to the corresponding elements of the embodiment shown in FIG. 1A.

In the embodiment of the VCSEL 101B according to the invention shown in FIG. 1B, the loss-determining element 117B includes the contoured loss control layer 119B. The loss control layer is contoured by the concave surface 123B in its surface 121B, remote from the upper mirror region 111. In the embodiment shown in FIG. 1B, the contoured loss control layer is formed of a dielectric material that is transparent to the light generated by the VCSEL 101B. The loss-control layer 119B is located on the surface 147 of the upper mirror region 111 with the concave surface 123B centered on the optical axis 105. The surface 147 is the surface of the upper mirror region remote from the active region 125 (FIG. 1A). Part of the contoured loss control layer overlays the electrode 131B that is also on the surface 147 of the upper mirror region.

The contoured loss control layer is a layer of dielectric material that is transparent to the light generated in the active region 125 (FIG. 1A). For example, the dielectric material may be silicon nitride ($Si_3N_4$), or other suitable dielectric materials, such as silicon dioxide ($SiO_2$) or titanium dioxide ($TiO_2$).

The thickness of the contoured loss control layer 119B is determined by the dimensions of the concave surface 123B: the thickness of the contoured loss control layer must be sufficient to accommodate the concave surface. The depth of the concave surface measured along the optical axis between the center of the concave surface and the part of the concave surface that overlies the boundary 159 of the core zone 115 is much greater than $\lambda/4n$, where n is the refractive index of the dielectric material of the contoured loss control layer 119B. In an experimental device, the contoured loss control layer was made by forming the concave surface 123B in a layer of silicon nitride about one $\mu$m thick.

The concave surface 123B of the contoured loss-control layer 119B acts both to diffract the light in the optical cavity 103 and to spread or de-focus the light in the optical cavity laterally similar to the concave surface 123 described above with reference to FIG. 1A. The contoured loss-control layer 119B provides an optical loss in the optical cavity that increases with increasing lateral distance from the optical axis.

The electrode 131B is a metallized electrode of the appropriate type for the conductivity mode of the upper mirror region 111. Since the dielectric material of the contoured loss control layer 119B is insulating, the electrode 131B is located on the surface 147 of the upper mirror region 111, remote from the active region (not shown). The electrode 131B is centered on the optical axis 105, and partially overlaps the core zone 115 of the upper mirror region. The electrode 131B is formed to include the light emission port 129B through which the light generated by the VCSEL 101B is emitted. The light emission port is also centered on the optical axis.

The effectiveness of the loss-determining element in increasing the maximum single-mode power that can be generated by the VCSEL depends on the fraction of the light in the optical cavity that is subject to the lateral distance-dependent loss imposed by the loss-determining element. This fraction depends on the reflectivity of the upper mirror region interposed between the light-generating region and the loss-determining element. The upper mirror region of a typical conventional top-emitting VCSEL includes about 20 pairs of layers and has a reflectivity close to unity. This means that the fraction of the light in the optical cavity that is subject to the lateral distance-dependent loss imposed by the loss-determining element is very small. As a result, the full potential of the loss-determining element to increase the maximum single-mode power is not fully realized when the upper mirror region has a conventional, high reflectivity.

In the embodiment shown in FIG. 1A, the potential of the loss-determining element 117 to increase the maximum single-mode power of the VCSEL can be more fully realized by omitting a few pairs of layers from the upper mirror region 111 to decrease its reflectivity. This increases the fraction of the light in the optical cavity 103 that is subject to the lateral distance-dependent loss imposed by the loss-determining element, and increases the effectiveness of the loss-determining element. However, this increase in the effectiveness of the loss-determining element is achieved at the expense a higher overall optical loss in the optical cavity. The higher overall optical loss in the optical cavity increases the threshold current of the VCSEL. The threshold current is the minimum value of the laser current at which laser action takes place. The threshold current may become unacceptably large if more than about four pairs of layers are removed from the upper mirror region.

Figure 2:
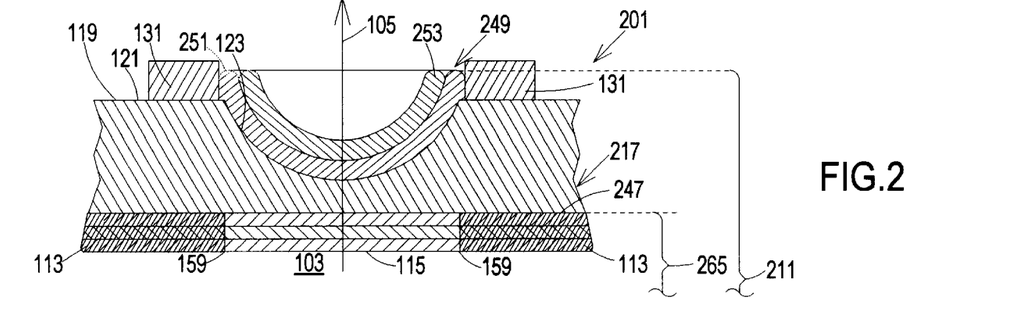
FIG. 2 shows a second embodiment of the VCSEL according to the invention in which the upper mirror region includes two mirror elements.

FIG. 2 shows a second embodiment 201 of the VCSEL according to the invention. The second embodiment is based on the first embodiment shown in FIG. 1A.

Compared with the first embodiment shown in FIG. 1A, the structure of the VCSEL 201 shown in FIG. 2 enables more of the potential of the loss-determining element to increase the maximum single-mode power generated by the VCSEL to be realized without the undesirable side effect of an increased threshold current. Elements in FIG. 2 corresponding to elements in FIG. 1A are indicated by the same reference numerals and will not be described again here. Also, elements of the VCSEL below the upper part of the upper mirror region 211 are omitted from FIG. 2, since these elements are identical to the corresponding elements of the embodiment shown in FIG. 1A.

In the embodiment shown in FIG. 2, the upper mirror region 211 is composed of a serial arrangement of two mirror elements, namely, the dielectric mirror 249 and the conductive mirror 265. Both mirror elements contribute to the reflectivity of the upper mirror region. The two-element structure of the upper mirror region 211 enables the optical cavity 103 to have a low optical loss, even though the conductive mirror has a lower reflectivity than that of the upper mirror region of the embodiment shown in FIG. 1A. The two-element structure of the upper mirror region 211 also subjects a greater fraction of the light in the optical cavity 103 to lateral distance-dependent diffraction and lateral spreading or defocusing by the loss-determining element 217. The two-element structure of the upper mirror region 211 therefore enables more of the potential of the loss-determining element to increase the maximum single mode intensity generated by the VCSEL 201 to be realized without an increase in the threshold current.

The conductive mirror 265 is structurally similar to the upper mirror region 111 of the embodiment shown in FIG. 1A, but differs in that it has fewer pairs of layers, such as the layers 133 and 135 (FIG. 1), to decrease its reflectivity. For example, the conductive mirror may typically have between six and ten fewer pairs of layers than the upper mirror region of a conventional VCSEL having the same threshold current.

The dielectric mirror 249 has a periodic structure of thin dielectric layers, for example, the layers 251 and 253, with alternating higher and lower refractive indices. Each layer has a thickness of $q\lambda/4n_3$, where $n_3$ is the refractive index of the dielectric material of the layer and q is an odd integer. The dielectric mirror is preferably formed of alternating layers of silicon dioxide $SiO_2$ and titanium oxide $TiO_2$ or alternating layers of silicon dioxide $SiO_2$ and silicon nitride $Si_3N_4$. Alternatively, the dielectric mirror may be formed of alternating layers of other suitable pairs of dielectric or semiconductor materials.

The number of pairs of layers, such as the layers 251 and 253, in the dielectric mirror 249 is preferably that which gives the dielectric mirror sufficient reflectivity for the upper mirror region 211 to have an overall reflectivity that sets the threshold current of the VCSEL 201 at an acceptably-low value, despite the relatively low reflectivity of the conductive mirror. For example, a threshold current similar to that of a conventional VCSEL can be obtained if the number of layers in the dielectric mirror gives the dielectric mirror a reflectivity that results in the upper mirror region 211 having an overall reflectivity that approximates the reflectivity of the upper mirror region of the conventional VCSEL.

The loss-determining element 217 is composed of the contoured loss control layer 119 sandwiched between the conductive mirror 265 and the dielectric mirror 249. The contoured loss control layer is contoured by the concave surface 123 in the surface 121, remote from the conductive mirror 265. In the embodiment shown in FIG. 2, the contoured loss control layer is a layer of semiconductor material that is transparent to the light generated by the VCSEL 201. The contoured loss control layer is located on the surface 247 of the conductive mirror, remote from the active region (not shown). The dielectric mirror 249 is located on the concave surface of the contoured loss control layer.

Dividing the upper mirror region 211 into two elements, the conductive mirror 265 and the dielectric mirror 249, increases the effectiveness of the loss-determining element 217, and enables the VCSEL 201 to generate a greater maximum single-mode intensity than that generated by the embodiment shown in FIG. 1A.

The variation shown in FIG. 1B may be modified in a way similar to that described above to increase the effectiveness of the loss-determining element 117B.

Fabrication of the embodiment shown in FIG. 2, and of the above-mentioned variation of the embodiment shown in FIG. 1B, in which a dielectric mirror 249 augments the reflectivity of the upper mirror region 211, may be simplified by replacing the multi-layer conductive mirror 265 with a single layer of semiconductor. Another benefit of this is that interference between light reflected by the interface between the layer of semiconductor and the contoured loss control layer and light reflected by the dielectric mirror is much weaker than interference between light reflected by the multi-layer conductive mirror and light reflected at the curved surface 223. Strong interference can result in Newton's rings-type interference patterns. The semiconductor layer has a thickness of an integral multiple of $\lambda/2n_6$, where $n_6$ is the refractive index of the material of the semiconductor layer, and is doped to make it highly conductive. The semiconductor layer has a much lower reflectivity than the conductive mirror, and the dielectric mirror provides substantially all of the reflectivity of the upper mirror region 211.

Figure 3A:
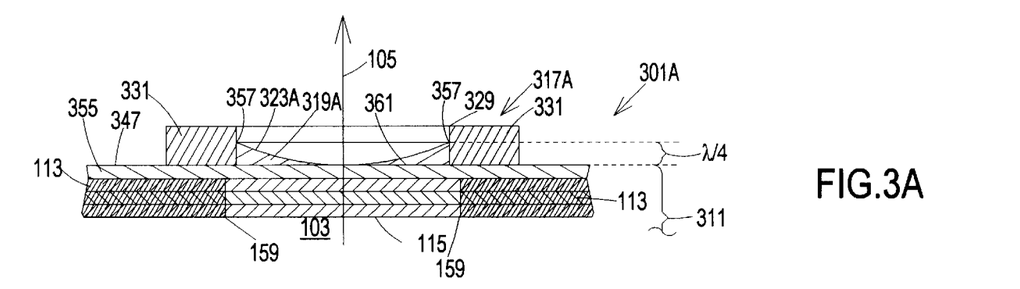
FIG. 3A shows a third embodiment of the VCSEL according to the invention in which the contoured loss control element is a concave layer of anti-reflective material.
Figure 3B:
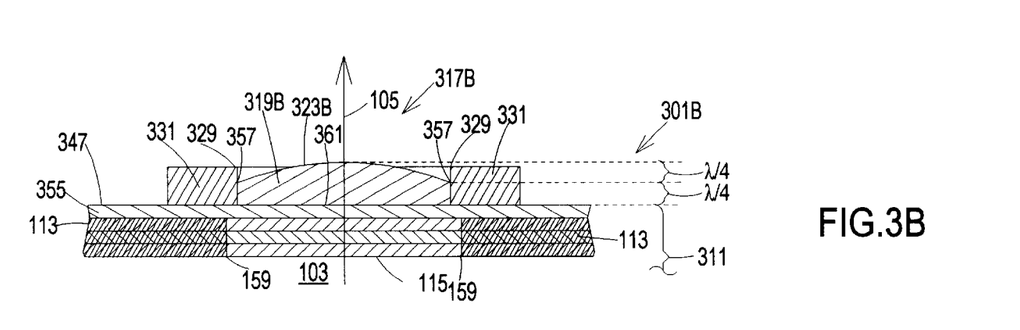
FIG. 3B shows a fourth embodiment of the VCSEL according to the invention in which the contoured loss control element is a convex layer of anti-reflective material.

Additional embodiments of the VCSEL according to the invention are shown in FIGS. 3A and 3B, and in FIGS. 4A–4D. In contrast to the embodiments shown in FIGS. 1A, 1B and 2, in which the respective loss-determining elements 117 operate by diffraction and lateral spreading or defocusing to provide an optical loss that increases with lateral distance from the optical axis 105, the loss-determining elements 317 and 417 in the embodiments shown in FIGS. 3A and 3B, and in FIGS. 4A–4D, respectively, operate by reflection to provide an optical loss that increases with lateral distance from the optical axis.

The embodiments shown in FIGS. 3A and 3B will be described first. Elements in FIGS. 3A and 3B corresponding to elements in FIG. 1A are indicated by the same reference numerals and will not be described again here. Corresponding elements in the embodiments shown in FIGS. 3A and 3B are indicated by the same reference numerals with the letter A or B, respectively, appended. References to such reference numerals without the corresponding letter are to be taken to refer to the respective elements in both embodiments. For example, a reference to the contoured loss control layer 319 will be taken to refer to both the contoured loss control layer 319A shown in FIG. 3A and the contoured loss control layer 319B shown in FIG. 3B. Elements of the VCSELs below the top four layers of the upper mirror region 311 are omitted from FIGS. 3A and 3B, since these elements are identical to the corresponding elements in the embodiment shown in FIG. 1A.

The common features of the embodiments shown in FIGS. 3A and 3B will be described first. In the VCSELs 301A and 301B respectively shown in FIGS. 3A and 3B, the loss-determining element 317 is located on the surface 347 of the upper mirror region 311, inside the light emission port 329 of the electrode 331. The loss-determining element is composed of the contoured loss control layer 319. The contoured loss control layer is a layer of anti-reflective material contoured by the curved surface 323 centered the optical axis 105. The contouring of the contoured loss control layer progressively decreases the reflectivity of the upper mirror region with increasing lateral distance from the optical axis. At the optical axis, the contoured loss control layer has a thickness of about $m\lambda/4n_4$, where m is an even integer, and $n_4$ is the refractive index of the anti-reflective material of the contoured loss control layer. The curved surface 323 causes the thickness of the contoured loss control layer to increase (FIG. 3A) or decrease (FIG. 3B) progressively with increasing lateral distance from the optical axis such that, at the peripheral portion 357, the thickness of the contoured loss control layer differs from the thickness at the optical axis by about $\pm\lambda/4n_4$. The peripheral portion 357 is the portion of the contoured loss control layer adjacent the lateral extent of the optical cavity 103. The lateral extent of the optical cavity approximately corresponds to the boundary 159 between the core zone 115 and the low-reflectivity zone 113. In the embodiments shown in FIGS. 3A and 3B, the peripheral portion is shown located at the boundary between the contoured loss control layer and the annular electrode 311. The peripheral portion may alternatively be further inset towards the optical axis from the boundary 159, or may be located a short distance outside the boundary 159.

The annular electrode 331 is deposited on the surface of the upper mirror region 311 partially overlapping the core zone 115. The upper mirror region 311 preferably includes the current spreading layer 355. This enables the laser current to pass between the annular electrode 331 and the active region (not shown) with a minimal voltage drop even though the annular electrode mostly overlies the low reflectivity zone 113, which has a much lower electrical conductivity than the core zone. The semiconductor material of the one or more layers of the upper mirror region constituting the current spreading layer is heavily doped with the same mode of dopant as the semiconductor material of the rest of the upper mirror region to make the current spreading layer highly conductive.

The anti-reflective material of the contoured loss control layer 319 is a transparent dielectric with a refractive index $n_4=(n_5 n_0)^{1/2}$, where $n_5$ is the refractive index of the material of the top-most layer of the upper mirror region 311, i.e., the current spreading layer 355, and $n_0$ is the refractive index of the medium bounding the curved surface 323. This medium is normally air, some kind of inert gas, or vacuum. In this disclosure, references to "air" will be taken to encompass "gas" and "vacuum." With a gallium arsenide current spreading layer, the refractive index of the anti-reflective material should be between 1.9 and 2.0. Dielectrics with a refractive index in this range include silicon nitride ($Si_3N_4$) and titanium oxide ($TiO_2$). Silicon oxide $SiO_x$, with the value of x adjusted to provide the desired refractive index, may also be used.

In the embodiment shown in FIG. 3A, the contoured loss control layer 319A has an almost zero thickness (m=0) at the optical axis 105. The curved surface 323A of the contoured loss control layer is concave, which causes the thickness of the contoured loss control layer to increase progressively with increasing lateral distance from the optical axis to reach a thickness of $\lambda/4n_4$ at the peripheral portion 357. In the embodiment shown in FIG. 3B, the contoured loss control layer 319B has a thickness of $\lambda/2n_4$ (m=2) at the optical axis. The curved surface 323B of the contoured loss control layer is convex, which causes the thickness of the contoured loss control layer to decrease progressively with increasing lateral distance from the optical axis to reach a thickness of $\lambda/4n_4$ at the peripheral portion 357.

The way in which the loss-determining element 317 increases the optical loss of the optical cavity 103 with increasing distance from the optical axis 105 in the lateral direction r will now be described, first with reference to the conventional VCSEL shown in FIG. 5. Elements in FIG. 5 corresponding to elements in FIG. 1A are indicated by the same reference numerals and will not be described again here. Also, elements of the conventional VCSEL below the top three layers of the upper mirror region are omitted from FIG. 5, since these elements are identical to the corresponding elements in the embodiment of the VCSEL according to the invention shown in FIG. 1A.

Figure 5:
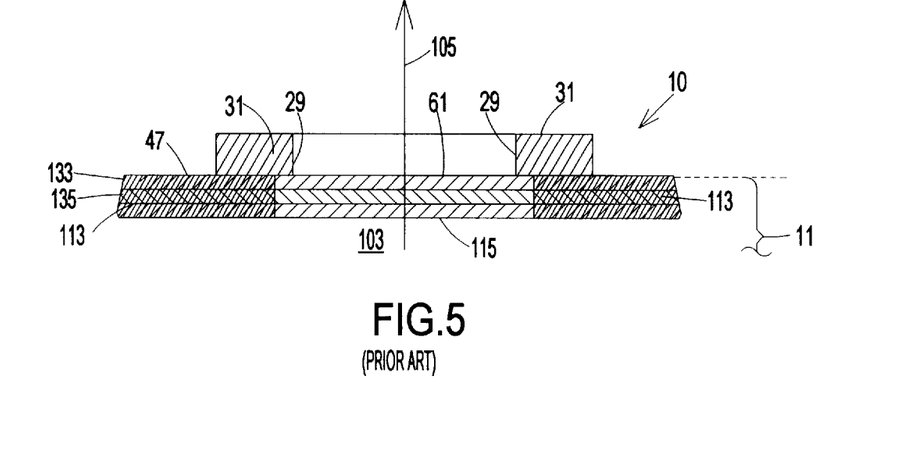
FIG. 5 shows a conventional VCSEL.

FIG. 5 shows the conventional VCSEL 10 having a structure similar to the VCSELs according to the invention, but lacking a loss-determining element. In the VCSEL 10, the surface portion 61 is exposed to air. The surface portion 61 is the portion of the surface 47 of the upper mirror region 11 inside the light-emission port 29 of the electrode 31. Light is reflected by the semiconductor-air boundary at the surface portion 61. The reflectivity of the surface portion 61 is roughly equal to the reflectivity of four pairs of layers, such as the pair of layers 133 and 135, of the upper mirror region, and therefore contributes significantly to the reflectivity of the upper mirror region. Hence, the optical loss of the optical cavity 103 depends on the reflectivity of the surface portion 61.

Returning now to FIGS. 3A and 3B, the contoured loss control layer 319 has a thickness of $m\lambda/4n_4$ at the optical axis 105, where m is an even integer, and the curved surface 323 causes the thickness to increase or decrease progressively with increasing lateral distance from the optical axis such that, at the peripheral portion 357, the thickness of the contoured loss control layer differs from the thickness at the optical axis by $\pm\lambda/4n_4$. At the optical axis, the thickness of the contoured loss control layer is such that light reflected by the curved surface 323 is in phase with the light reflected by the upper mirror region 311, and the reflectivity of the upper mirror region at the optical axis is substantially the same as if a semiconductor-air interface of normal reflectivity existed at the surface portion 361. Consequently, at the optical axis, the contoured loss control layer has a negligible effect on the reflectivity of the upper mirror region, and, hence, on the optical loss of the optical cavity 103.

The thickness of the contoured loss control layer 319 at the peripheral portion 357 is such that light reflected at the concave surface 323 is in antiphase with the light reflected by the upper mirror region 311. The contoured loss control layer substantially eliminates reflection by the part of the surface portion 361 underlying the peripheral portion 357, which decreases the reflectivity of the part of the upper mirror region underlying the peripheral portion. Thus, the contoured loss control layer makes the optical loss of the part of the optical cavity underlying the peripheral portion 357 greater than the optical loss of the optical cavity at the optical axis 105.

Figure 3C:
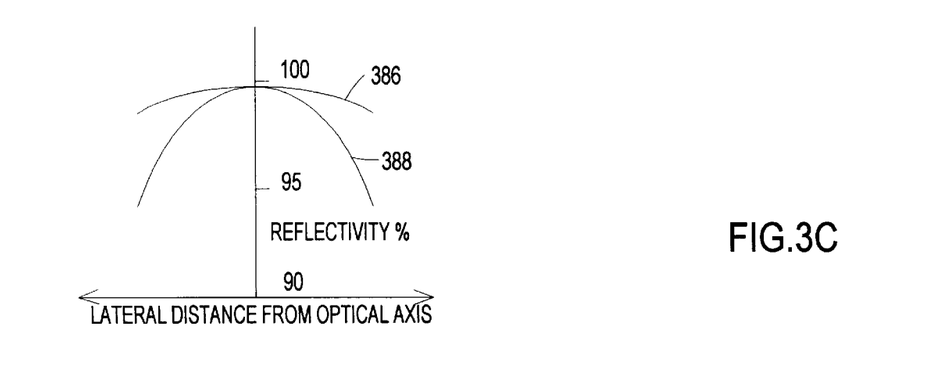
FIG. 3C is a graph showing the variation of reflectivity with lateral distance from the optical axis for the embodiments shown in FIGS. 3A and 3B and for the embodiments shown in FIGS. 4A–4D.

Between the optical axis 105 and the peripheral portion 357, the thickness of the contoured loss control layer 319 progressively changes by $\pm\lambda/4n_4$. As a result, the phase difference between the light reflected by the curved surface 323 and the light reflected by the upper mirror region 311 changes progressively from 0° to 180° with increasing lateral distance from the optical axis. Consequently, with increasing lateral distance from the optical axis, the reflectivity of the upper mirror region 311 progressively falls from a maximum at the optical axis to a minimum at the peripheral portion 357, as illustrated by the curve 386 in FIG. 3C, and the optical loss of the optical cavity 103 progressively increases from a minimum at the optical axis to a maximum at the peripheral portion 357. The increase in the optical loss of the optical cavity with increasing lateral distance from the optical axis means that on-axis single mode operation of the VCSEL 301 is favored, and that the threshold for off-axis multi-mode operation is substantially increased.

As in the embodiments shown in FIGS. 1A and 1B, the embodiments shown in FIGS. 3A and 3B have a greater single-mode output power than a conventional VCSEL even when the loss-determining element 317 is deposited on an upper mirror region having a reflectivity similar to that of a conventional VCSEL, or an upper mirror region whose reflectivity has been reduced by removing fewer than about four pairs of layers. However, similar to the embodiment shown in FIG. 2, the effectiveness of the loss-determining element can be increased by dividing the upper mirror region into a serial arrangement of two mirror elements with the loss-determining element sandwiched between them. The upper mirror region is divided into a conductive mirror having substantially fewer pairs of layers than the upper mirror region of a conventional VCSEL, and a dielectric mirror that restores the reflectivity of the upper mirror region to about that of the upper mirror region of a conventional VCSEL having the same threshold current.

Variations on the embodiments shown in FIGS. 3A and 3B, in which the upper mirror region is divided into two elements, are shown in FIGS. 4A–4D.

Compared with the embodiments shown in FIGS. 3A and 3B, the structures of the VCSELs shown in FIGS. 4A–4D enable more of the potential of the loss-determining element 417 to increase the maximum single-mode power generated by the VCSEL to be realized without the undesirable side effect of an increased threshold current. Elements in FIGS. 4A–4D corresponding to elements in FIGS. 1A, 3A, and 3B are indicated by the same reference numerals and will not be described again here. Corresponding elements in the embodiments shown in FIGS. 4A, 4B, 4C and 4D are indicated using the same reference numerals with the letter A, B, C, or D, respectively, appended. References to such reference numerals without the corresponding letter are to be taken to refer to the respective elements in all four embodiments. Finally, elements of the VCSELs below the upper part of the upper mirror region are omitted from FIGS. 4A–4D, since these elements are identical to the corresponding elements of the embodiment shown in FIG. 1A.

The common features of the embodiments shown in FIGS. 4A–4D will be described first. In the embodiments shown in FIGS. 4A–4D, the upper mirror region 411 is composed of a serial arrangement of two mirror elements, namely, the dielectric mirror 449 and the conductive mirror 465. Both mirror elements contribute to the reflectivity of the upper mirror region. The two-element structure of the upper mirror region enables the optical cavity 103 to have a low optical loss at the optical axis, even though the conductive mirror has a much lower reflectivity than the upper mirror region of a conventional VCSEL having about the same threshold current. The two-element structure of the upper mirror region 411 also subjects a greater fraction of the light in the optical cavity 103 to lateral distance-dependent reflection by the loss-determining element 417. The two-element structure of the upper mirror region 411 therefore realizes more of the potential of the loss-determining element to increase the maximum single mode intensity generated by the VCSEL without an increase in threshold current.

The conductive mirror 465 is structurally similar to the upper mirror region of the VCSEL 101 shown in FIG. 1A, but differs in that it has fewer pairs of layers, such as the layers 133 and 135 (FIG. 1A), to decrease its reflectivity. For example, the conductive mirror may typically have between six and ten fewer pairs of layers than the upper mirror region of an embodiment of the VCSEL 101 having about the same value of threshold current.

The dielectric mirror 449 has a periodic structure of thin dielectric layers, with alternating higher, (e.g., the layer 451) and lower (e.g., the layer 453) refractive indices. Each layer has a thickness of $\lambda/4n_3$, where $n_3$ is the refractive index of the material of the dielectric layer. The dielectric mirror is preferably formed of alternating layers of silicon dioxide $SiO_2$ and titanium oxide $TiO_2$ or alternating layers of silicon dioxide $SiO_2$ and silicon nitride $Si_3N_4$. Alternatively, the dielectric mirror may be formed of alternating layers of other suitable pairs of dielectric or semiconductor materials.

The number of pairs of dielectric layers, such as the layers 451 and 453, in the dielectric mirror 449 is preferably that which gives the dielectric mirror such a reflectivity that the overall reflectivity of the upper mirror region 411 at the optical axis 105 is about the same as that of a conventional VCSEL having about the same threshold current, despite the lower reflectivity of the conductive mirror compared with that of the upper mirror region of the conventional VCSEL.

The loss-determining element 417 is composed of the contoured loss control layer 419 sandwiched between the conductive mirror 465 and the dielectric mirror 449. The contoured loss control layer is located on the surface 447 of the conductive mirror, remote from the active region (not shown). The contoured loss control layer is contoured by the curved surface 423, centered on the optical axis 105. The dielectric mirror 449 is located on the curved surface of the contoured loss control layer 419. The curvature of the curved surface 423 is such that the thickness of the contoured loss control layer progressively changes by about $\pm\lambda/4n_4$ with increasing lateral distance between the optical axis 105 and the peripheral portion 457, where $n_4$ is the refractive index of the contoured loss control layer. The peripheral portion 457 is the portion of the contoured loss control layer that overlies the lateral extent of the optical cavity 103. The lateral extent of the optical cavity approximately corresponds to the boundary 159 between the core zone 115 and the low-reflectivity zone 113. In the embodiments shown in FIGS. 4A–4D, the peripheral portion 457 is shown located at the boundary between the contoured loss control layer and the annular electrode 311. The peripheral portion may alternatively be further inset towards the optical axis from the boundary 159, or may be located a short distance outside the boundary 159.

The contoured loss control layer 419 is a contoured layer of anti-reflective material and is preferably a layer of one of the materials of the dielectric mirror. The thickness of the contoured loss control layer at the optical axis 105 depends on whether the contoured loss control layer is a layer of the higher refractive index material or a layer of the lower refractive index material. Independent of whether the contoured loss control layer is a layer of the higher refractive index material or a layer of the lower refractive index material, the thickness of the contoured loss control layer progressively changes by about $\pm\lambda/4n_4$ between the optical axis and the peripheral portion 457.

Figure 4A:
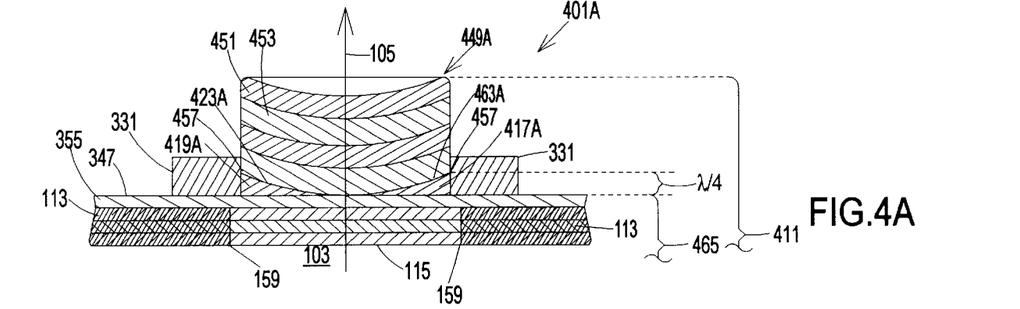
FIGS. 4A–4D show variations on the third and fourth embodiments of the VCSEL according to the invention in which the upper mirror region includes two mirror elements.
Figure 4B:
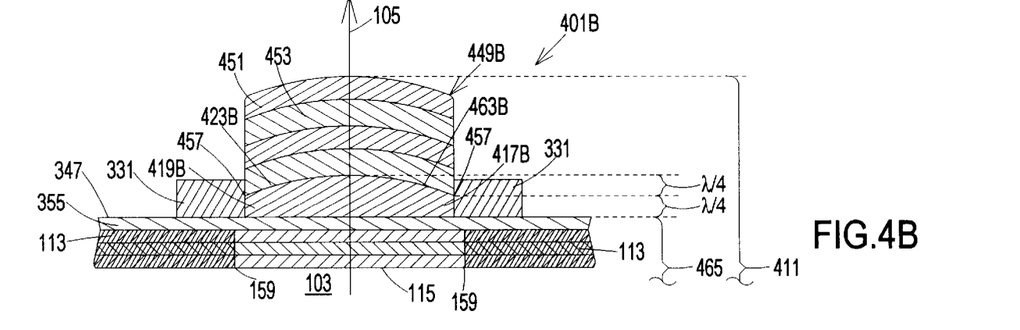

In the embodiments shown in FIGS. 4A and 4B, the contoured loss control layers 419A and 419B are both layers of higher refractive index dielectric material, i.e., the same material as that of the layer 451. When the contoured loss control layer is a layer of the higher refractive index material, the contoured loss control layer has a thickness of $m\lambda/4n_4$ at the optical axis, where m is an even integer, and $n_4$ is the refractive index of the material of the contoured loss control layer. Also, when the contoured loss control layer is a layer of the higher refractive index material, the dielectric mirror has an even number of layers, so that the outermost layer 451 is a layer of the higher refractive index material.

Figure 4C:
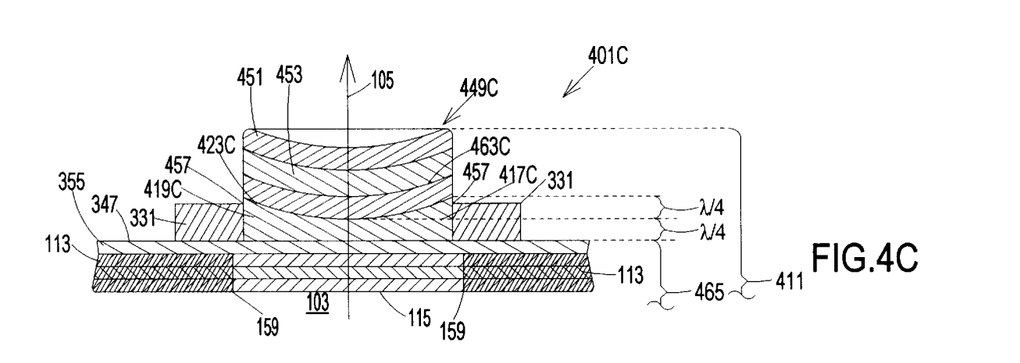
Figure 4D:
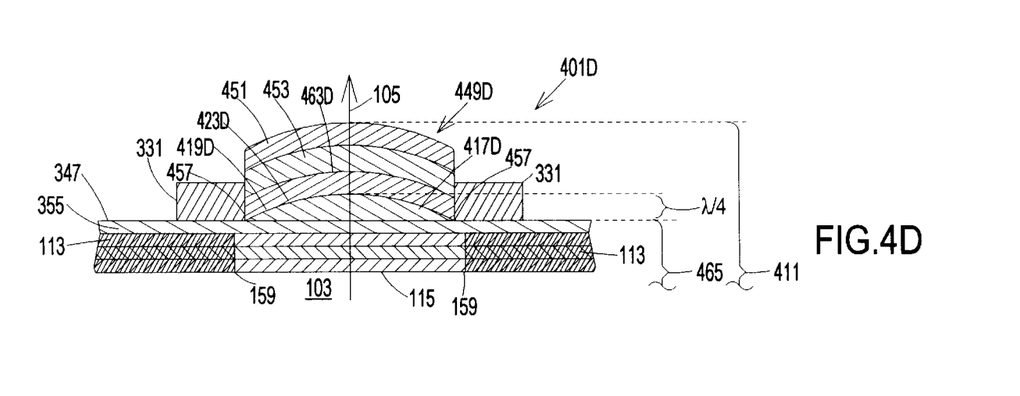

In the embodiments shown in FIGS. 4C and 4D, the contoured loss control layers 419C and 419D are both layers of lower refractive index dielectric material, i.e., the same material as that of the layer 453. When the contoured loss control layer is a layer of the lower refractive index material, the contoured loss control layer has a thickness of $p\lambda/4n_4$ at the optical axis, where p is an odd integer, and $n_4$ is the refractive index of the material of the contoured loss control layer. Also, when the contoured loss control layer is a layer of refractive index material, the dielectric mirror has an odd number of layers to make the outermost layer 451 a layer of the higher refractive index material as in the embodiments shown in FIGS. 4A and 4B.

As noted above, the thickness of the contoured loss control layer progressively changes by about $\pm\lambda/4n_4$ between the optical axis 105 and the peripheral portion 457, independent of whether the contoured loss control layer is a layer of the higher refractive index material or the lower refractive index material. In the embodiments shown in FIGS. 4A and 4B, the respective contoured loss control layers 419A and 419B are layers of the higher refractive index material having a thickness of about $m\lambda/4n_4$ at the optical axis. In the embodiment shown in FIG. 4A, the contoured loss control layer 419A has an almost zero thickness (m=0) at the optical axis. The curved surface 423A of the contoured loss control layer is concave, which causes the thickness of the contoured loss control layer to increase progressively with increasing lateral distance from the optical axis to reach a thickness of $\lambda/4n_4$ at the peripheral portion 457. In the embodiment shown in FIG. 4B, the contoured loss control layer 419B has a thickness of about $\lambda/2n_4$ (m=2) at the optical axis. The curved surface 423B of the contoured loss control layer is convex, which causes the thickness of the contoured loss control layer to decrease progressively with increasing lateral distance from the optical axis to reach a thickness of about $\lambda/4n_4$ at the peripheral portion 457.

In the embodiments shown in FIGS. 4C and 4D, the respective contoured loss control layers 419C and 419D are layers of the lower refractive index material having a thickness of $p\lambda/4n_4$ at the optical axis. In the embodiment shown in FIG. 4C, the contoured loss control layer 419C has a thickness of about $\lambda/4n_4$ (p=1) at the optical axis. The curved surface 423C of the contoured loss control layer is concave, which causes the thickness of the contoured loss control layer to increase progressively with increasing lateral distance from the optical axis to reach a thickness of about $\lambda/2n_4$ at the peripheral portion 457. In the embodiment shown in FIG. 4D, the contoured loss control layer 419D also has a thickness of about $\lambda/4n_4$ (p=1) at the optical axis. The curved surface 423D of the contoured loss control layer is convex, which causes the thickness of the contoured loss control layer to decrease progressively with increasing lateral distance from the optical axis to reach a thickness of substantially zero at the peripheral portion 457.

Dividing the upper mirror region 411 into two mirror elements, the conductive mirror 465 and the dielectric mirror 449, increases the effectiveness of the loss-determining element 417, and enables the loss-determining element to provide a much greater increase in the optical loss of the optical cavity with increasing lateral distance from the optical axis than in the embodiments shown in FIGS. 3A and 3B. This is illustrated by the curve 388 in FIG. 3C.

The greater increase in the optical loss of the optical cavity with increasing lateral distance from the optical axis is obtained in the embodiments shown in FIGS. 4A–4D as follows. At the optical axis, the length of the optical path between the surface 347 and the high-index to low-index boundary 463 is an integral multiple of $\lambda/2n_7$, where $n_7$ is the average refractive index of the material in the optical path. As a result, light reflected at the high index-low index boundary 463 and by the remaining layers of the dielectric mirror 449 is all in phase with the light reflected by the conductive mirror 465. The reflectivity of the dielectric mirror greatly augments the low reflectivity of the conductive mirror, and provides the upper mirror region with a high overall reflectivity at the optical axis 105.

At the peripheral portion 457, the length of the optical path between the surface 347 and the high-index to low-index boundary 463 is an odd integral multiple of $\lambda/4n_7$. As a result, light reflected at the high index-low index boundary and by the remaining layers of the dielectric mirror 449 is out of phase with the light reflected by the conductive mirror 465. The light reflected at the high index-low index boundary, and by the remaining layers of the dielectric mirror reduces the reflectivity of the conductive mirror. The overall reflectivity of the upper mirror region at the peripheral portion 457 is therefore less than that of the conductive mirror alone, and is much less than the combined reflectivity of the conductive mirror and the dielectric mirror.

Between the optical axis 105 and the peripheral portion 457, the phase difference between the light reflected by the dielectric mirror and that reflected by the conductive mirror progressively changes so that light reflected by the dielectric mirror augments the reflectivity of the conductive mirror 465 by an amount that progressively diminishes to zero at a point part-way between the optical axis and the peripheral portion. Then, between the part-way point and the peripheral portion, light reflected by the dielectric mirror reduces the reflectivity of the conductive mirror by an amount that progressively increases. The effect of the reflectivity of the dielectric mirror on the reflectivity of the conductive mirror at a given point between the optical axis and the peripheral portion depends on the length of the optical path between the surface 347 and the high-low index boundary 463 at the point.

Figure 6:
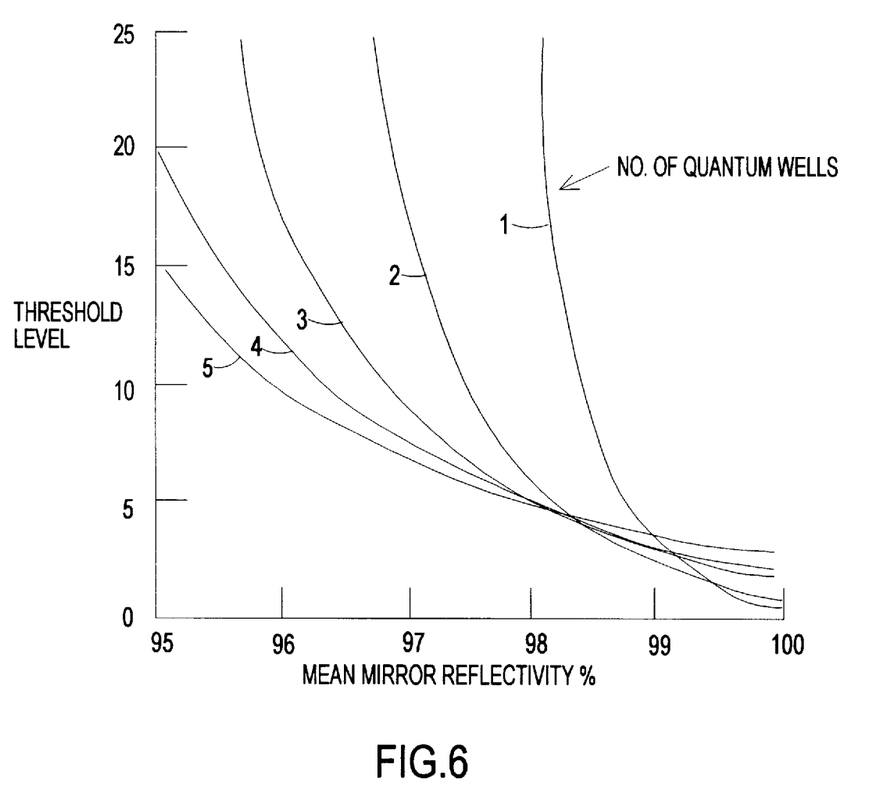
FIG. 6 is a graph showing how the threshold level of a VCSEL varies according to the reflectivity of the mirror regions with different numbers of quantum wells in the active region.

The effectiveness of the loss-determining element 317 and 417 respectively shown in FIGS. 3A and 3B, and in FIGS. 4A–4D can be increased by decreasing the number of quantum wells in the light-generating region 109 (FIG. 1). FIG. 6 shows the effect of varying the reflectivity of the mirror regions 107 and 111 (FIG. 1A) on the threshold level of VCSELs having different numbers of quantum wells in the light-generating region. The slope of the curves is greater when there are fewer quantum wells in the light-generating region. In other words, a given change in threshold level requires a smaller change of reflectivity when there are fewer quantum wells in the light-generating region. Hence, reducing the number of quantum wells in the light-generating region increases the change in threshold level that results from a given lateral distance-dependent change in reflectivity produced by the loss-determining elements 317 and 417.

An example of a method that can be used to form the curved surface 323 of the embodiment of the VCSEL according to the invention shown in FIG. 3B will now be described with reference to FIGS. 7A–7J. The method can be adapted to form the curved surfaces in the other embodiments of the VCSEL described above.

FIGS. 7A–7J show the top three layers of the upper mirror region 311 of what will become the VCSEL 301B. Before the processing that will be described below, the low reflectivity zone 113 surrounding the core zone 115 is formed conventionally by implanting ions into the upper mirror region. The process by which the layers of the upper mirror region and the underlying layers are deposited on a semiconductor wafer to form a basic VCSEL structure is conventional, and will not be described here.

In the following description, various operations will be described as being applied to the wafer. It is to be understood that, when such process steps are applied to the wafer, they are also applied to all of the layers deposited on the wafer.

Figure 7A:
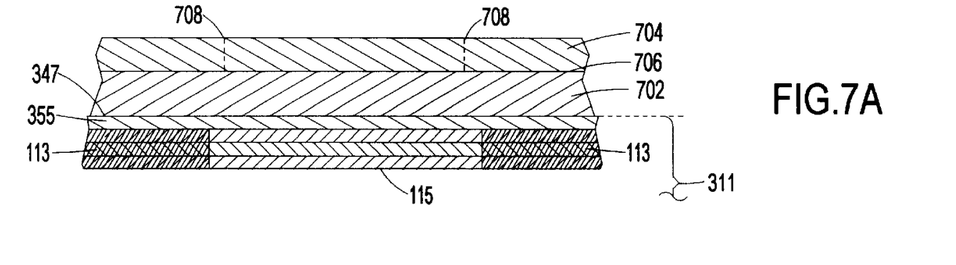
FIGS. 7A–7J illustrate a process that may be used to make the contoured loss control layer of the embodiment of the VCSEL according to the invention shown in FIG. 3B.

In the VCSEL 301B shown in FIG. 3B, the loss-determining element 317B, composed of the contoured loss control layer 319B, is made by forming the convex surface 323B in a layer of anti-reflective material. To form the loss-determining element, the layer 702 of the anti-reflective material is deposited by evaporation or by chemical vapor deposition (CVD), for example, on the surface 347 of the upper mirror region 311, and the layer of photoresist 704 is spun onto the surface 706 of the layer 702, as shown in FIG. 7A.

A mask (not shown) defining a circular aperture, the boundaries of which are indicated by the broken lines 708, is placed adjacent the photoresist layer 704, centered on the core zone 115. The photoresist layer is exposed through the mask to a suitable source of radiation, such as ultra violet light. The photoresist layer is then washed to remove the photoresist layer except the part exposed to the source of radiation. This part of the photoresist layer remains on the surface of the anti-reflective layer 702 as the cylindrical photoresist pillar 710 shown in FIG. 7B.

The wafer is then heated to about 250°–300° C. for between about five and about 20 minutes. Heating the photoresist pillar 710 causes the photoresist to melt and form the etch mask 714. Surface tension causes the molten photoresist to assume the smooth, convex shape shown in FIG. 7C. The etch mask retains its convex shape when the photoresist solidifies as the wafer cools.

Figure 7B:
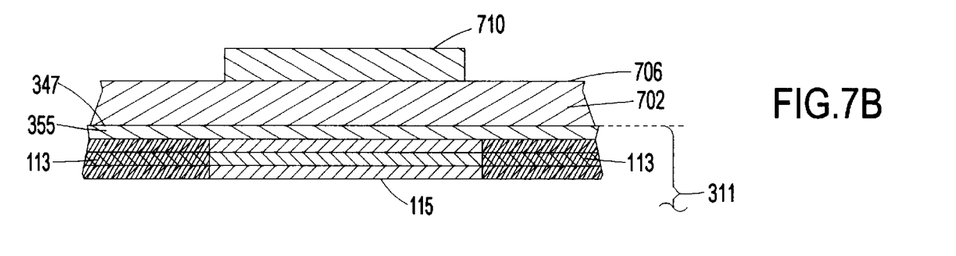
Figure 7C:
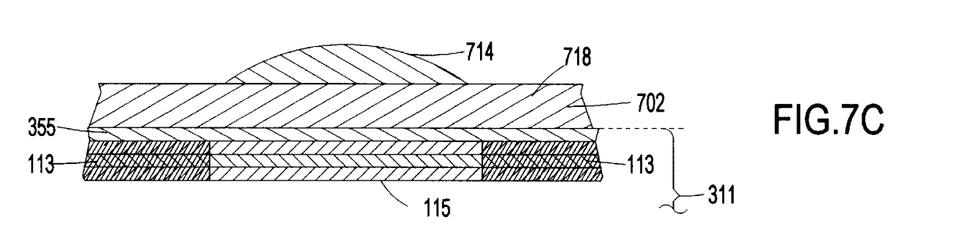
Figure 7D:
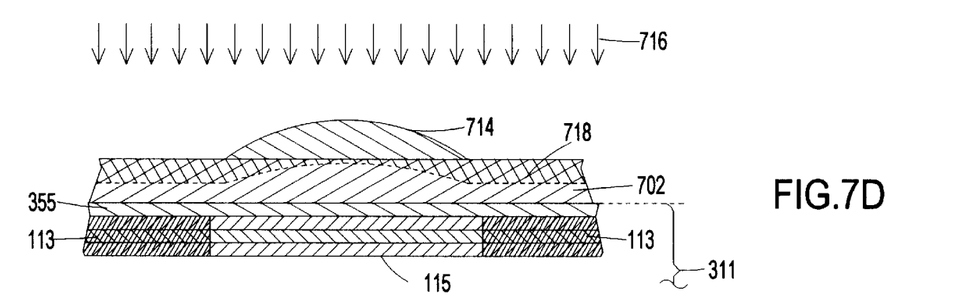

The wafer is then subject to dry etching using ion milling or reactive ion etching (RIE), indicated by the arrows 716 in FIG. 7D, to transfer the thickness profile of the etch mask 714 to the anti-reflective layer 702. For example, the wafer may be bombarded with argon ions with a power of 50–100W. Dry etching removes the etch mask and the region 718 of the anti-reflective layer 702 where the etch mask provides no protection or a reduced amount of protection. The depth profile of the region 718 depends on the shape of the etch mask and the etch rate ratio between the material of the anti-reflective layer and the photoresist material of the etch mask.

Figure 7E:
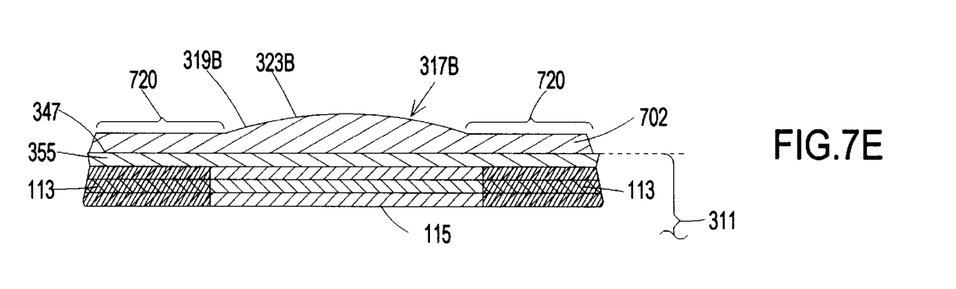

The dry etch leaves the anti-reflective layer 702 profiled as shown in FIG. 7E. The contoured loss control element 319B bounded by the convex surface 323B is centered on the core zone 115 of the upper mirror region 311. The contoured loss control element is bounded by the zone 720 of the anti-reflective layer covering the surface 347 of the upper mirror region. The anti-reflective material is about $\lambda/4n_4$ thick in the zone 720.

Figure 7F:
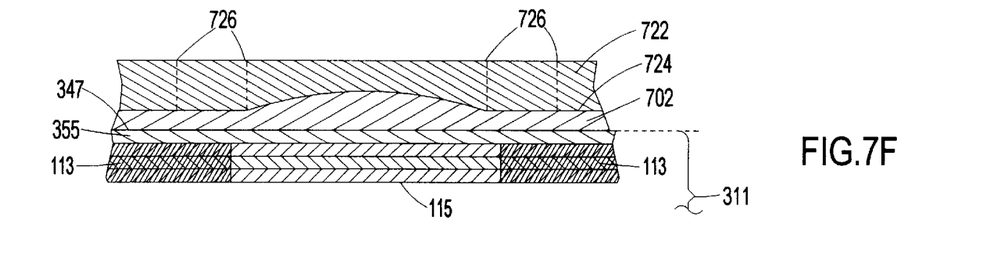

A new layer of photoresist 722 is next spun onto the surface 724 of the anti-reflective layer 702, as shown in FIG. 7F.

Figure 7G:
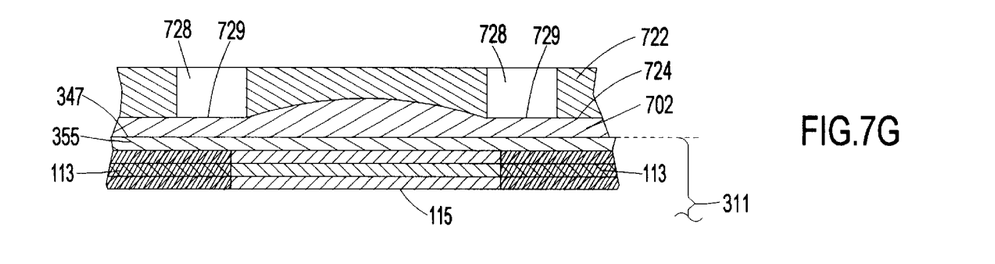

A mask (not shown) defining the shape of the annular electrode 331 shown in FIG. 3B, the boundaries of which are indicated by the broken lines 726, is placed adjacent the photoresist layer 722, centered on the core zone 115. The photoresist layer is exposed through the mask to a suitable source of radiation, such as ultra violet light. The photoresist layer is then washed to remove the part of the photoresist layer defined by the mask. This forms the annular aperture 728 and exposes the annular part 729 of the surface 724 of the anti-reflective layer 702. The remainder of the surface of the anti-reflective layer remains protected by the photoresist layer, as shown in FIG. 7G.

Figure 7H:
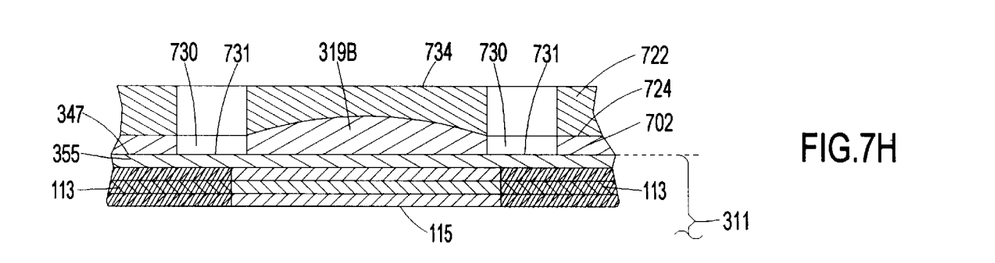

The wafer is then subject to an anisotropic etch, which etches the annular part 729 of the surface 724 of the anti-reflective layer 702 via the annular aperture 728. This defines the final shape of the contoured loss control layer 319B, forms the annular aperture 730 in the anti-reflective layer, and exposes the annular part 731 of the surface 347 of the upper mirror region 311, as shown in FIG. 7H.

Figure 7I:
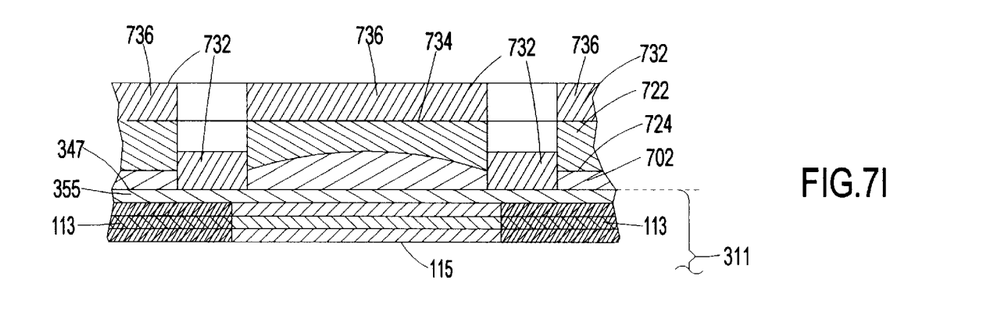
Figure 7J:
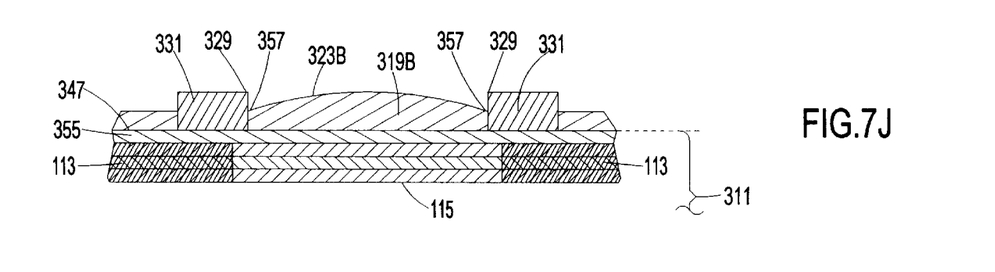

The additional steps illustrated in FIGS. 7I and 7J enable the photoresist layer 722 that defines the final shape of the contoured loss control layer 319B to be also used to define the shape of the electrode 331. A layer 732 of metal, such as gold, is deposited by evaporation, for example. The metal layer 732 is deposited on the surface 734 of the photoresist layer 722 where the photoresist layer protects the surface 347 of the upper mirror region, and is deposited on the annular part 731 of the surface 347 of the upper mirror region exposed by the aperture 730, as shown in FIG. 7I.

Finally, the wafer is washed in a solvent that dissolves the photoresist layer 732. Dissolving the photoresist layer also removes the parts 736 of the metal layer 732 deposited on the surface 734 of the photoresist layer 722, but leaves the part of the metal layer deposited on the annular part 731 of the surface 347 of the upper mirror region as the annular electrode 331. The annular electrode surrounds the contoured loss control layer 319B with the light emission port 329 in the electrode adjacent the peripheral portion 357 of the contoured loss control layer, as shown in FIG. 7J.

Additional layers of dielectric materials having alternating higher and lower refractive indices, each having a uniform thickness of $\lambda/4n_3$, where $n_3$ is the refractive index of the material of the layer, may be deposited on the curved surface 323B by evaporation, CVD or another suitable way, to form the dielectric mirrors 449B or 449D of the embodiments respectively shown in FIGS. 4B and 4D. The dielectric mirror is preferably formed of alternating layers of silicon dioxide $SiO_2$ and titanium oxide $TiO_2$ or alternating layers of silicon dioxide $SiO_2$ and silicon nitride $Si_3N_4$.

The process described above can be adapted to form the concave surface 123 in the semiconductor layer 119 of the embodiments shown in FIGS. 1A and 2, the concave surface 123B in the dielectric layer 119B of the embodiment shown in FIG. 1B, the concave surface 323A in the contoured loss control layer 319A of the embodiment shown in FIG. 3A, and the concave surfaces 423A and 423C in the contoured loss control layers 419A and 419C of the embodiments shown in FIGS. 4A and 4C, respectively. To form such concave surfaces, a layer of semiconductor, dielectric, or anti-reflective material, as appropriate, is deposited on the surface of the upper mirror region as the loss control layer, and is overlaid by a layer of photoresist. The photoresist used must be one that, when molten, will wet the surface of the loss control layer. A mask and solvent process similar to that illustrated in FIG. 7B is used to form a circular aperture in the photoresist layer overlaying the core zone 115. When the photoresist layer is melted by heating in the step illustrated by FIG. 7C, the molten photoresist flows into the aperture to form a concave depression centered on the core zone. The dry etch step illustrated in FIG. 7D is then used to transfer the profile of the concave depression in the photoresist layer to the underlying loss control layer.

Although this disclosure describes illustrative embodiments of the invention in detail, it is to be understood that the invention is not limited to the precise embodiments described, and that various modifications may be practiced within the scope of the invention defined by the appended claims.

We claim:

1. A vertical cavity surface emitting laser (VCSEL) for radiating a high-intensity single-mode light beam along an optical axis, the VCSEL comprising:
    an optical cavity having an optical loss, the optical cavity including:
        a first mirror region and a second mirror region, the first mirror region and the second mirror region being conductive and having opposite conductivity modes,
        a plane light-generating region sandwiched between the first mirror region and the second mirror region, perpendicular to the optical axis, and
        means for defining a lateral extent of the optical cavity in the plane of the light-generating region; and
    loss-determining means, coupled to the optical cavity, for progressively increasing the optical loss of the optical cavity with increasing lateral distance from the optical axis.

2. The VCSEL of claim 1, in which the loss-determining means includes means for progressively increasing the optical loss of the optical cavity with increasing lateral distance from the optical axis by one of diffraction, lateral spreading, and defocusing.

3. The VCSEL of claim 1, in which the loss-determining means includes means for imposing on the light in the optical cavity a reflection loss that progressively increases with increasing lateral distance from the optical axis.

4. The VCSEL of claim 1, in which the light-generating region includes no more than one quantum well.

5. A vertical cavity surface emitting laser (VCSEL) for radiating a high-intensity single-mode light beam along an optical axis, the VCSEL comprising:
    an optical cavity having an optical loss, the optical cavity including:
        a first mirror region and a second mirror region, the first mirror region and the second mirror region being conductive, and having opposite conductivity modes,
        a plane light-generating region sandwiched between the first mirror region and the second mirror region, perpendicular to the optical axis, and
        means for defining a lateral extent of the optical cavity in the plane of the light-generating region; and
    a single contoured loss control layer on a surface of the first mirror region, remote from the active region, the contoured loss control layer including a curved surface remote from the first mirror region and substantially centered on the optical axis.

6. The VCSEL of claim 5, in which the contoured loss control layer includes semiconductor material transparent to light generated in the light-generating region, the curved surface being formed in the semiconductor material.

7. The VCSEL of claim 5, in which the contoured loss control layer includes dielectric material transparent to light generated in the light-generating region, the curved surface being formed in the dielectric material.

8. The VCSEL of claim 5, in which the contoured loss control layer:
    includes an anti-reflective material;
    has a thickness of about $m\lambda/2n_4$ at the optical axis; and
    progressively changes in thickness by about $\pm\lambda/4n_4$ between the optical axis and a peripheral portion of the contoured loss control layer, the peripheral portion being located adjacent the lateral extent of the optical cavity, where $\lambda$ is the wavelength of the light generated in the light-generating region, m is an even integer, and $n_4$ is the refractive index of the anti-reflective material.

9. The VCSEL of claim 5, in which:
    the first mirror region includes a serial arrangement of:
        a conductive mirror, and
        a dielectric mirror; and
    the contoured loss control layer is sandwiched between the conductive mirror and the dielectric mirror.

10. The VCSEL of claim 9, in which:
    the dielectric mirror includes alternating layers of:
        a high-index dielectric material having a first refractive index, and
        a low-index dielectric material having a second refractive index, less than the first refractive index; and
    the contoured loss control layer:
        includes anti-reflective material, and
        progressively changes in thickness by about $\pm\lambda/4n_4$ between the optical axis and a lateral distance corresponding to the lateral extent of the optical cavity, where $\lambda$ is the wavelength of the light generated in the light-generating region, and $n_4$ is the refractive index of the anti-reflective material.

11. The VCSEL of claim 10, in which:
    the anti-reflective material of the contoured loss control layer has a refractive index closer to the first refractive index than the second refractive index; and
    the contoured loss control layer has a thickness of about $m\lambda/2n_4$ at the optical axis, where $\lambda$ is the wavelength of the light generated in the light-generating region, m is an even integer, and $n_4$ is the refractive index of the anti-reflective material.

12. The VCSEL of claim 11, in which the anti-reflective material of the contoured loss control layer includes the high-index dielectric material.

13. The VCSEL of claim 10, in which:

the anti-reflective material of the contoured loss control layer has a refractive index closer to the second refractive index than the first refractive index; and the contoured loss control layer has a thickness of about $p\lambda/4n_4$ at the optical axis, where $\lambda$ is the wavelength of the light generated in the light-generating region, p is an odd integer, and $n_4$ is the refractive index of the anti-reflective material.

14. The VCSEL of claim 13, in which the anti-reflective material of the contoured loss control layer includes the low-index dielectric material.

15. The VCSEL of claim 5, in which the light-generating region includes no more than one quantum well.

16. A vertical cavity surface emitting laser (VCSEL) for radiating a high-intensity single-mode light beam along an optical axis, the VCSEL comprising:

an optical cavity having an optical loss, the optical cavity including:

a first mirror region and a second mirror region, the first mirror region and the second mirror region being conductive and having opposite conductivity modes, the first mirror region comprising a serial arrangement of:

a multi-layer conductive mirror; and a multi-layer dielectric mirror, a plane light-generating region sandwiched between the conductive mirror and the second mirror region, perpendicular to the optical axis, and means for defining a lateral extent of the optical cavity in the plane of the light-generating region; and a contoured loss control layer of anti-reflective material sandwiched between the conductive mirror and the dielectric mirror, the contoured loss control layer having a thickness that progressively changes by about $\pm\lambda/4n_4$ between the optical axis and a lateral distance corresponding to the lateral extent of the optical cavity, where $\lambda$ is the wavelength of the light generated in the light-generating region and $n_4$ is the refractive index of the contoured loss control layer.

17. The VCSEL of claim 16, in which:

the dielectric mirror includes alternating layers of:

a high-index dielectric material having a first refractive index, and a low-index dielectric material having a second refractive index, less than the first refractive index.

18. The VCSEL of claim 17, in which:

the anti-reflective material of the contoured loss control layer has a refractive index closer to the first refractive index than the second refractive index; and the contoured loss control layer has a thickness of about $m\lambda/2n_4$ at the optical axis, where $\lambda$ is the wavelength of the light generated in the light-generating region, m is an even integer, and $n_4$ is the refractive index of the anti-reflective material.

19. The VCSEL of claim 17, in which:

the anti-reflective material of the contoured loss control layer has a refractive index closer to the second refractive index than the first refractive index; and the contoured loss control layer has a thickness of about $p\lambda/4n_4$ at the optical axis, where $\lambda$ is the wavelength of the light generated in the light-generating region, p is an odd integer, and $n_4$ is the refractive index of the anti-reflective material.

20. The VCSEL of claim 16, in which the light-generating region includes no more than one quantum well.

* * * * *